(12) United States Patent
Yamahara

(10) Patent No.: US 12,038,864 B2
(45) Date of Patent: Jul. 16, 2024

(54) SIGNAL PROCESSING CIRCUIT AND RECEPTION DEVICE

(71) Applicant: Kioxia Corporation, Tokyo (JP)

(72) Inventor: Yosuke Yamahara, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 217 days.

(21) Appl. No.: 17/654,488

(22) Filed: Mar. 11, 2022

(65) Prior Publication Data

US 2023/0087104 A1    Mar. 23, 2023

(30) Foreign Application Priority Data

Sep. 17, 2021    (JP) .................. 2021-152581

(51) Int. Cl.
*G06F 13/42* (2006.01)
*G11C 19/28* (2006.01)
*H03F 3/04* (2006.01)
*H03K 3/037* (2006.01)

(52) U.S. Cl.
CPC .......... *G06F 13/4291* (2013.01); *G11C 19/28* (2013.01); *H03F 3/04* (2013.01); *H03K 3/037* (2013.01)

(58) Field of Classification Search
None
See application file for complete search history.

(56) References Cited

U.S. PATENT DOCUMENTS

| | | | |
|---|---|---|---|
| 5,450,111 A * | 9/1995 | Mutoh | B41J 2/02 347/78 |
| 7,934,112 B2 | 4/2011 | Von Bokern et al. | |
| 9,244,872 B2 | 1/2016 | Barbiero et al. | |
| 10,073,808 B2 | 9/2018 | Wu et al. | |
| 2011/0181556 A1* | 7/2011 | Sakai | G09G 3/3685 345/204 |
| 2014/0218221 A1* | 8/2014 | Wortman | H04L 7/0012 341/100 |
| 2021/0033673 A1* | 2/2021 | Tilleman | H03K 19/1776 |

FOREIGN PATENT DOCUMENTS

| | | |
|---|---|---|
| JP | 4630288 B2 | 2/2011 |
| JP | 6378197 B2 | 8/2018 |
| JP | 6745289 B2 | 8/2020 |

* cited by examiner

*Primary Examiner* — Henry Tsai
*Assistant Examiner* — Dean Phan
(74) *Attorney, Agent, or Firm* — Oblon, McClelland, Maier & Neustadt, L.L.P.

(57) ABSTRACT

According to an embodiment, a shift register parallelizes a serial data signal serving to transfer data including multiple symbols on the basis of a first clock. A first circuit generates, on the basis of the first clock, a second clock being a clock signal for transferring a parallel data signal having a width of the first number of bits. A first flip-flop group sequentially fetches data of the first number of bits from the serial data signals parallelized by the shift register on the basis of the second clock. The first flip-flop group then outputs the fetched data of the first number of bits as a parallel data signal. A second circuit adjusts a phase of the second clock such that the first flip-flop group fetches data of the first number of bits beginning with bit data located at a head of each symbol of the multiple symbols.

16 Claims, 11 Drawing Sheets

STEADY STATE

WHEN PHASE SHIFT REQUEST OCCURS

SIGNAL PROCESSING CIRCUIT AND RECEPTION DEVICE

CROSS-REFERENCE TO RELATED APPLICATIONS

This application is based upon and claims the benefit of priority from Japanese Patent Application No. 2021-152581, filed on Sep. 17, 2021; the entire contents of which are incorporated herein by reference.

FIELD

Embodiments described herein relate generally to a signal processing circuit and a reception device.

BACKGROUND

Serial communication standards such as PCIe (trademark) have been known. A reception device compliant with such a serial communication standard includes a signal processing circuit to convert a received serial data signal into a parallel data signal. When performing the conversion of the serial data signal into the parallel data signal, the signal processing circuit performs symbol alignment in which the bit data located at the head of each symbol received as the serial data signal is aligned at the position of bit 0 of the parallel data signal.

DETAILED DESCRIPTION

According to the present embodiment, a signal processing circuit includes a shift register, a first circuit, a first flip-flop group, and a second circuit. The shift register parallelizes, on the basis of a first clock, a serial data signal serving to transfer data including a plurality of symbols. The first clock is a clock signal for transferring the serial data signal. The first circuit generates, on the basis of the first clock, a second clock being a clock signal for transferring a parallel data signal having a width of the first number of bits. The first flip-flop group sequentially fetches data of the first number of bits from the serial data signal parallelized by the shift register on the basis of the second clock. The first flip-flop group then outputs the sequentially fetched data of the first number of bits as a parallel data signal. The second circuit adjusts the phase of the second clock generated by the first circuit such that the first flip-flop group fetches data of the first number of bits beginning with bit data located at a head of each symbol of the plurality of symbols.

A signal processing circuit and a reception device according to embodiments can be applied to any device capable of receiving a serial data signal. Here, as an example, an information processing system including a host and a memory system will be described. The host and the memory system can communicate with each other in compliance with the standard of PCIe (trademark). Hereinafter, the signal processing circuit and the reception device according to embodiments will be described in detail with reference to the accompanying drawings. Note that the present invention is not limited by these embodiments.

First Embodiment

Figure 1:
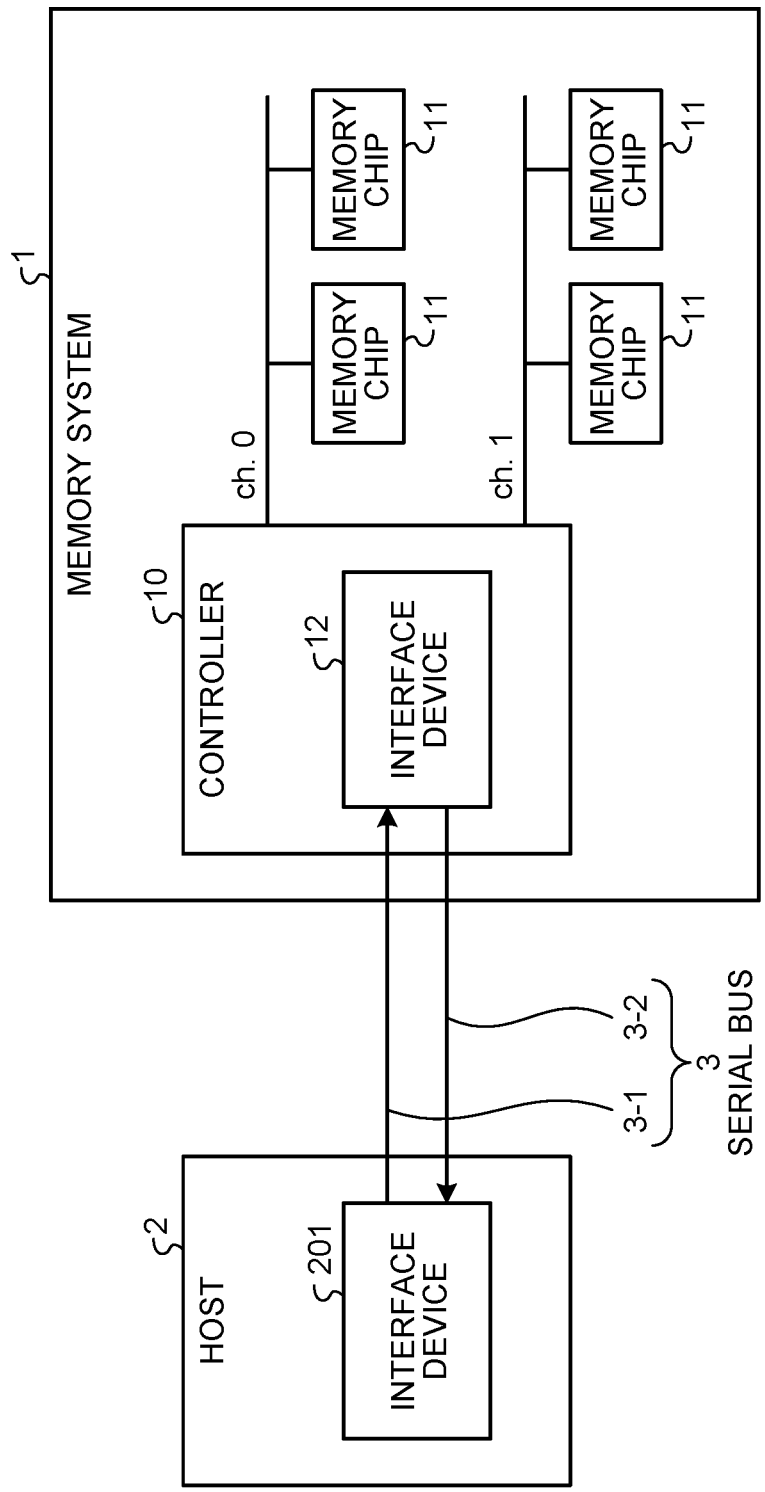
FIG. 1 is a schematic diagram illustrating an example of a configuration of an information processing system to which a reception device according to a first embodiment is applied.

FIG. 1 is a schematic diagram illustrating an example of a configuration of an information processing system to which a reception device according to a first embodiment is applied. The information processing system includes a memory system 1 and a host 2. The memory system 1 and the host 2 are connected by a serial bus 3 which is capable of serial communication compliant with the standard of PCIe (trademark). Note that the standard of communication between the memory system 1 and the host 2 is not limited to PCIe (trademark). Any serial communication standard is applicable.

The serial bus 3 includes a pair of a first communication path 3-1 and a second communication path 3-2. The first communication path 3-1 is used for transferring a serial data signal from the host 2 to the memory system 1. The second communication path 3-2 is used for transferring a serial data signal from the memory system 1 to the host 2. The serial data signal transferred through each of the first communication path 3-1 and the second communication path 3-2 is a differential signal. Thus, the first communication path 3-1 and the second communication path 3-2 are each configured by two signal lines. Note that the pair of the first communication path 3-1 and the second communication path 3-2 is also referred to as a lane. The serial bus 3 may include two or more lanes.

The memory system 1 includes four memory chips 11 and a controller 10. The four memory chips 11 are connected to the controller 10 via two channels (ch. 0 and ch. 1). Each memory chip 11 is a memory chip of a NAND flash memory. Note that the number of memory chips and the number of channels included in the memory system 1 are not limited to the above. In addition, each memory chip 11 is not limited to a memory chip of a NAND flash memory.

The controller 10 performs data transfer between the host 2 and the four memory chips 11. In addition, the controller 10 manages the four memory chips 11. The controller 10 includes an interface device 12 servers to transfer data to the host 2 via the serial bus 3. The interface device 12 is an example of a reception device.

The host 2 is, for example, a processor such as a central processing unit (CPU). The host 2 is able to request the memory system 1 to store data and read data. The host 2 includes an interface device 201 serves to transfer data to the memory system 1 via the serial bus 3.

Figure 2:
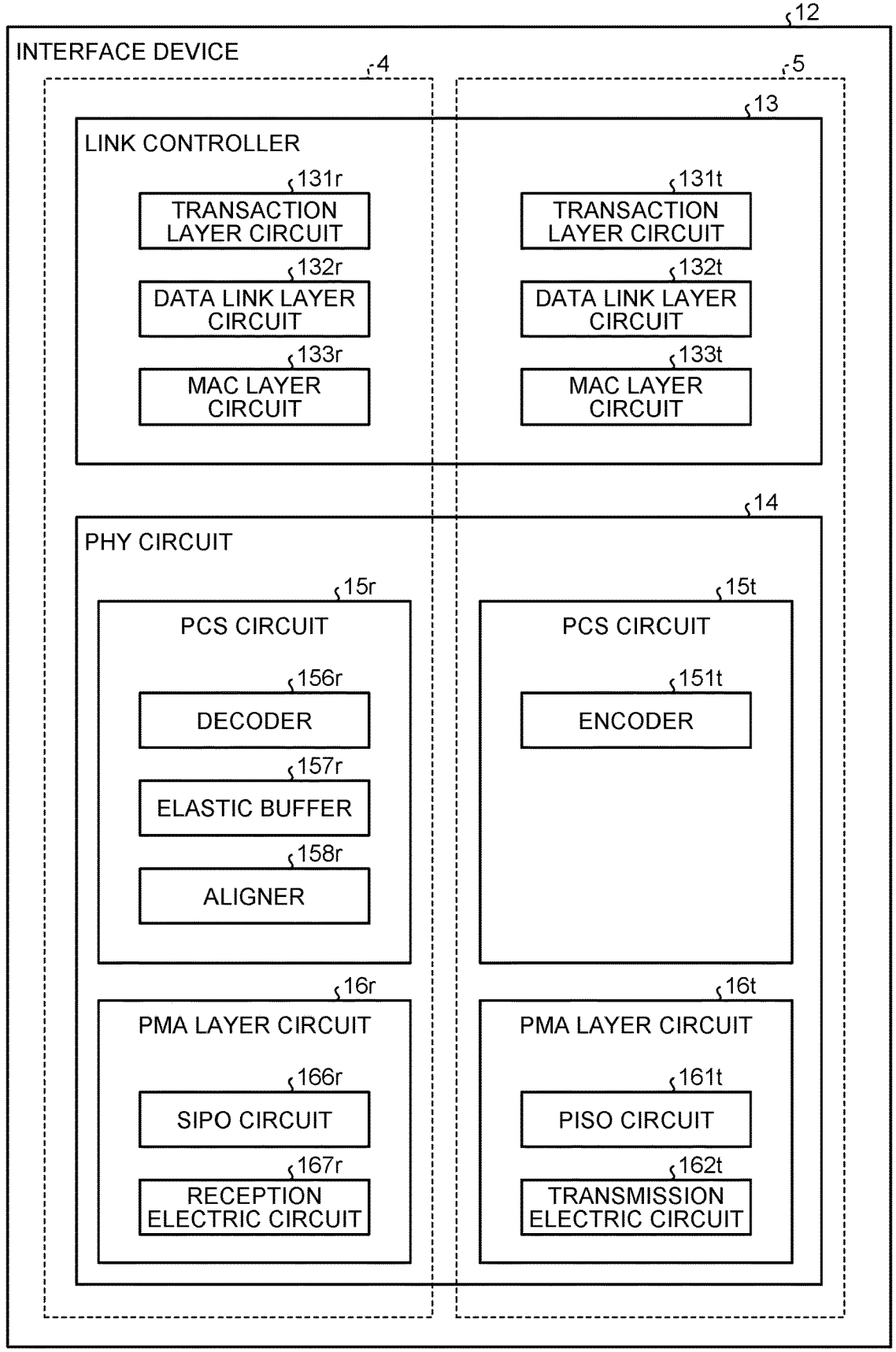
FIG. 2 is a schematic diagram illustrating an example of a configuration of an interface device that is the reception device included in a memory system according to the first embodiment.

FIG. 2 is a schematic diagram illustrating an example of a configuration of the interface device 12 included in the memory system 1 according to the first embodiment. Note that the interface device 201 included in the host 2 may have a configuration similar to that of the interface device 12 illustrated in the drawing.

The interface device 12 includes a link controller 13 and a PHY circuit 14. The PHY circuit 14 is an example of a signal processing circuit.

The link controller 13 includes transaction layer circuits 131$r$ and 131$t$, data link layer circuits 132$r$ and 132$t$, and media access controller (MAC) layer circuits 133$r$ and 133$t$. The PHY circuit 14 includes physical coding sub-layer (PCS) circuits 15$r$ and 15$t$, and physical media attachment (PMA) layer circuits 16$r$ and 16$t$.

A circuit group that implements communication compliant with the standard of PCIe (trademark) is classified into three layers of a transaction layer, a data link layer, and a physical layer from the upper side in accordance with its roles. Further above the transaction layer, there is a software layer. The circuit group that implements the physical layer is further classified into three sublayers of a MAC layer, a PCS, and a PMA layer.

In the circuit groups included in the interface device 12, the transaction layer circuits 131$r$ and 131$t$ are circuits that function as the transaction layer. The data link layer circuits 132$r$ and 132$t$ are circuits that function as the data link layer. The MAC layer circuits 133$r$ and 133$r$ are circuits that function as the MAC layer in the physical layer. The PCS circuits 15$r$ and 15$t$ are circuits that function as the PCS in the physical layer. The PMA layer circuits 16$r$ and 16$t$ are circuits that function as the PMA layer in the physical layer.

In the circuit groups included in the interface device 12, the transaction layer circuit 131$r$, the data link layer circuit 132$r$, the MAC layer circuit 133$r$, the PCS circuit 15$r$, and the PMA layer circuit 16$r$ constitute a reception circuit group 4. In the circuit groups included in the interface device 12, the transaction layer circuit 131$t$, the data link layer circuit 132$t$, the MAC layer circuit 133$t$, the PCS circuit 15$t$, and the PMA layer circuit 16$t$ constitute a transmission circuit group 5.

The link controller 13 performs data transfer between the software layer and the PHY circuit 14.

More specifically, the transaction layer circuit 131$t$ generates a transaction layer packet (TLP) in response to a request from the software layer, and then transmits the TLP to the data link layer circuit 132$t$. The transaction layer circuit 131$r$ analyzes the data received from the data link layer circuit 132$r$ and transmits the data to the software layer in accordance with the analysis result.

The data link layer circuit 132$t$ adds a sequence number and an error correction code to the TLP received from the transaction layer circuit 131$t$ and transmits the TLP to the MAC layer circuit 133$t$. The data link layer circuit 132$r$ checks the sequence number and the error correction code of the packet received from the MAC layer circuit 133$r$. Then, the data link layer circuit 132$r$ transmits a notification of reception completion or a request for retransmission to the transmission side in accordance with the confirmation result.

The MAC layer circuits 133$r$ and 133$t$ manage the state of communication via the serial bus 3. In addition, in a case where the serial bus 3 includes a plurality of lanes, the MAC layer circuits 133$r$ and 133$t$ perform de-skew between the lanes.

The PHY circuit 14 receives data from the link controller 13 as a parallel data signal. The PHY circuit 14 converts the parallel data signal received from the link controller 13 into a serial data signal and transmits the serial data signal to the communication partner, or converts the serial data signal received from the communication partner into a parallel data signal and transmits the parallel data signal to the link controller 13. Individual components of the PHY circuit 14 will be described below.

The PCS circuit 15$t$ includes an encoder 151$t$. The PCS circuit 15$t$ receives data from the data link layer circuit 132$t$ via the MAC layer circuit 133$t$. The encoder 151$t$ performs encoding on the data. Note that the encoding method by the encoder 151$t$ may vary depending on the generation of the PCIe (trademark). The PCS circuit 15$t$ transmits the encoded data to the PMA layer circuit 16$t$.

The PMA layer circuit 16$t$ includes a parallel-in serial-out (PISO) circuit 161$t$ and a transmission electric circuit 162$t$. The PISO circuit 161$t$ converts data given by the PCS circuit 15$t$ from a parallel data signal into a serial data signal. The transmission electric circuit 162$t$ outputs data converted into the serial data signal. In a state where the memory system 1 and the host 2 are connected, the data converted into the serial data signal is transmitted from the memory system 1 to the host 2 via the second communication path 3-2. The transmission electric circuit 162$t$ includes, for example, a driver circuit for transmission.

The PMA layer circuit 16$r$ includes a serial-in parallel-out (SIPO) circuit 166$r$ and a reception electric circuit 167$r$. In the state where the memory system 1 and the host 2 are connected, the reception electric circuit 167$r$ receives the serial data signal received from the host 2 via the first communication path 3-1. The reception electric circuit 167$r$ includes, for example, an amplifier (amplifier 21 in FIG. 3). The SIPO circuit 166$r$ converts the serial data signal received by the reception electric circuit 167$r$ into a parallel data signal by parallelizing the serial data signal.

The PCS circuit 15$r$ includes a decoder 156$r$, an elastic buffer 157$r$, and an aligner 158$r$.

The aligner 158$r$ performs symbol alignment on the parallel data signal generated by the SIPO circuit 166$r$. The symbol alignment is processing to align bit data located at the head of each symbol received as the serial data signal to the position of bit 0 of the parallel data signal. The position of bit 0 is a position to which bit data received first in the serial data signal before being parallelized is allocated among a plurality of bits of data transferred at a time as the parallel data signal.

The elastic buffer 157$r$ adjusts the frequency deviation of the parallel data signal after symbol alignment. After the symbol alignment, the decoder 156$r$ decodes the parallel data signal processed by the elastic buffer 157r. The decoding method by the decoder 156r corresponds to the encoding method by the encoder 151t. The PCS circuit 15r transmits the parallel data signal that is symbol-aligned, adjusted for frequency deviation, and decoded, to the MAC layer circuit 133r.

Figure 3:
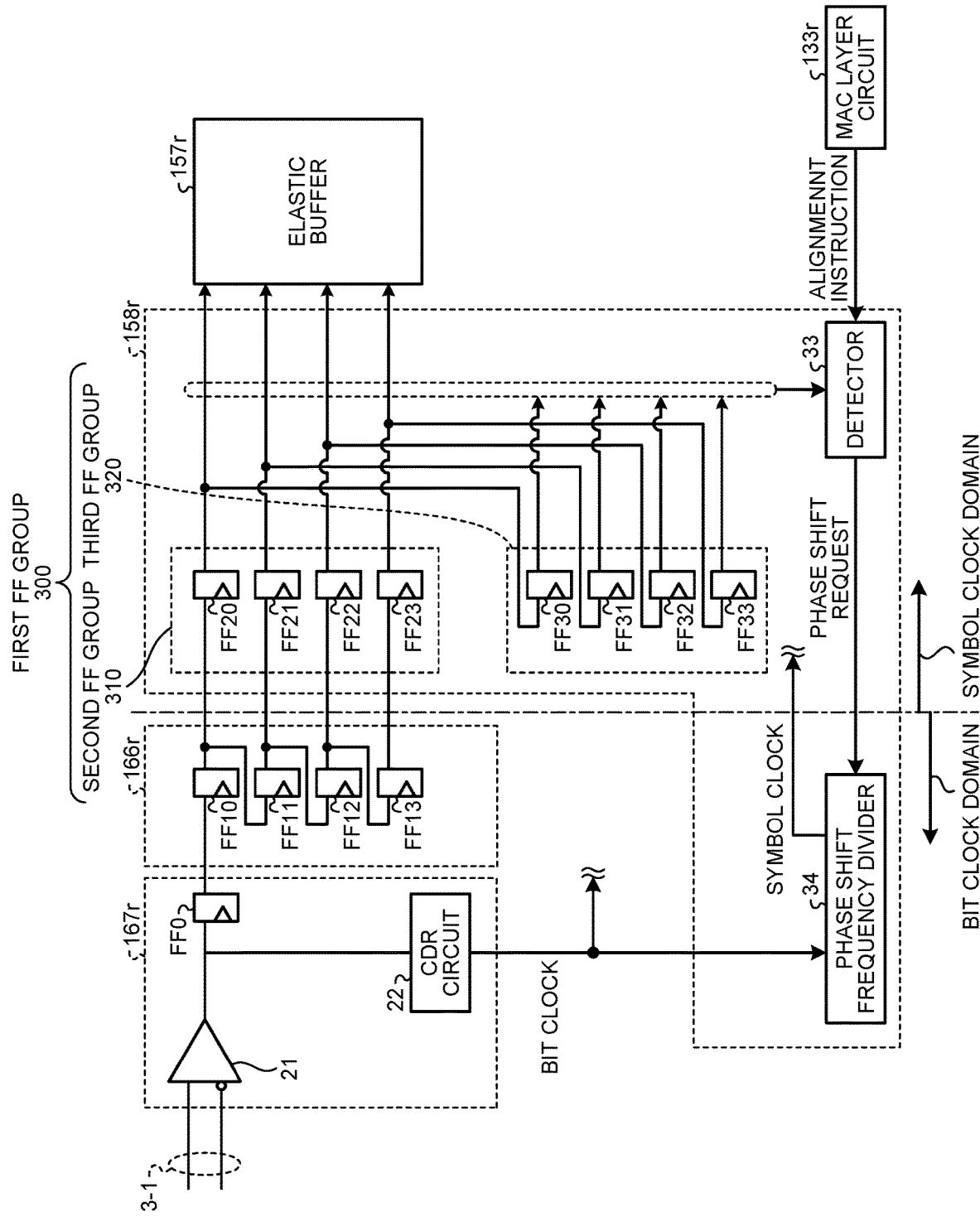
FIG. 3 is a schematic diagram illustrating an example of a detailed circuit configuration of a reception electric circuit, an SIPO circuit, and an aligner included in a PHY circuit which is a signal processing circuit according to the first embodiment.

FIG. 3 is a schematic diagram illustrating an example of a more detailed circuit configuration of the reception electric circuit 167r, the SIPO circuit 166r, and the aligner 158r according to the first embodiment.

The reception electric circuit 167r includes an amplifier 21, a flip-flop FF0, and a clock data recovery (CDR) circuit 22.

The amplifier 21 is a differential amplifier that amplifies a differential signal. The amplifier 21 amplifies the serial data signal transferred through the first communication path 3-1 as a differential signal.

The CDR circuit 22 acquires a clock of the serial data signal from the amplified serial data signal. The clock to be acquired by the CDR circuit 22 is referred to as a bit clock. In addition, one cycle of the bit clock is referred to as a bit cycle. The bit cycle corresponds to a period between two rising edges or two falling edges of the bit clocks adjacent to each other on the time axis. Alternatively, the bit cycle may correspond to a period between a rising edge of one bit clock and a falling edge of another bit clock adjacent to the one bit clock on the time axis.

The bit clock is used for driving the flip-flop FF0 and the SIPO circuit 166r. In addition, the bit clock is input to a phase shift frequency divider 34 described later. Although not illustrated in FIG. 3, the bit clock is supplied to the clock input terminal of the flip-flop FF0.

On the basis of the bit clock, the flip-flop FF0 fetches the serial data signal amplified by the amplifier 21 and inputs the serial data signal to the SIPO circuit 166r.

As described above, the SIPO circuit 166r converts the serial data signal into the parallel data signal. Here, for simplifying the description, it is assumed that the bit width of the parallel data signal is four bits and the size of one symbol of the serial data signal is four bits. The SIPO circuit 166r converts the input serial data signal into a parallel data signal having a 4-bit width. As a configuration therefor, the SIPO circuit 166r includes four flip-flops FF10, FF11, FF12, and FF13, each being driven in accordance with the bit clock.

The serial data signal output by the flip-flop FF0 is input to the flip-flop FF10. The serial data signal output by the flip-flop FF10 is input to the flip-flop FF11. The serial data signal output by the flip-flop FF11 is input to the flip-flop FF12. The serial data signal output by the flip-flop FF12 is input to the flip-flop FF13. Accordingly, the SIPO circuit 166r includes a shift register including four cascade-connected flip-flops FF10, FF11, FF12, and FF13. Although not illustrated in FIG. 3, the bit clock is supplied to the clock input terminals of each of the flip-flops FF10, FF11, FF12, and FF13.

With the above configuration, the SIPO circuit 166r parallelizes the serial data signal output by the flip-flop FF0 into four serial data signals in which the output timings of the bit data are shifted by one bit cycle.

The aligner 158r includes eight flip-flops FF20, FF21, FF22, FF23, FF30, FF31, FF32, and FF33, a detector 33, and a phase shift frequency divider 34.

The phase shift frequency divider 34 generates a clock for the parallel data signal on the basis of the bit clock. In this example, the bit width of the parallel data signal is four bits, so that the phase shift frequency divider 34 generates, as a clock for the parallel data signal, a clock having a period four times the bit clock. Hereinafter, the clock for the parallel data signal is referred to as a symbol clock. In addition, one cycle of the symbol clock is referred to as a symbol cycle.

Additionally, the phase shift frequency divider 34 shifts the phase of the symbol clock upon receiving a phase shift request from the detector 33.

The eight flip-flops FF20, FF21, FF22, FF23, FF30, FF31, FF32, and FF33, and the detector 33 are driven in accordance with the symbol clock. Although not illustrated in FIG. 3, the symbol clock is supplied to the clock input terminals of the flip-flops FF20, FF21, FF22, FF23, FF30, FF31, FF32, and FF33.

At a timing of a rising edge of the symbol clock, the flip-flop FF20 fetches 1-bit data from the serial data signal output by the flip-flop FF10 and outputs the fetched data. At a timing of a rising edge of the symbol clock, the flip-flop FF21 fetches 1-bit data from the serial data signal output by the flip-flop FF11 and outputs the fetched data. At a timing of a rising edge of the symbol clock, the flip-flop FF22 fetches 1-bit data from the serial data signal output by the flip-flop FF12 and outputs the fetched data. At a timing of a rising edge of the symbol clock, the flip-flop FF23 fetches 1-bit data from the serial data signal output by the flip-flop FF13 and outputs the fetched data. Thus, the four flip-flops FF20, FF21, FF22, and FF23 are able to acquire a parallel data signal having a 4-bit width from the serial data signals parallelized by the SIPO circuit 166r while synchronizing with the symbol clock.

At a timing based on the symbol clock, the flip-flop FF30 fetches 1-bit data output by the flip-flop FF20 and outputs the fetched data. At a timing based on the symbol clock, the flip-flop FF31 fetches 1-bit data output by the flip-flop FF21 and outputs the fetched data. At a timing based on the symbol clock, the flip-flop FF32 fetches 1-bit data output by the flip-flop FF22 and outputs the fetched data. At a timing based on the symbol clock, the flip-flop FF33 fetches 1-bit data output by the flip-flop FF23 and outputs the fetched data. Thus, the four flip-flops FF30, FF31, FF32, and FF33 output the 4-bit data which was output by the four flip-flops FF20, FF21, FF22, and FF23 one symbol cycle before.

In other words, the eight flip-flops FF20, FF21, FF22, FF23, FF30, FF31, FF32, and FF33 output a parallel data signal for two symbol cycles.

The detector 33 detects a symbol boundary on the basis of the parallel data signal for two symbol cycles output by the eight flip-flops FF20, FF21, FF22, FF23, FF30, FF31, FF32, and FF33.

More specifically, the interface device 12 may receive special pattern data for detecting a symbol boundary via the first communication path 3-1. A configuration of such special pattern data for detecting the symbol boundary is defined in the PCIe (trademark) standard. The special pattern data is referred to as a test pattern. In a period where the interface device 12 receives the test pattern, the detector 33 detects a symbol boundary on the basis of a test pattern for two symbol cycles output from the eight flip-flops FF20, FF21, FF22, FF23, FF30, FF31, FF32, and FF33 as the parallel data signal for two symbol cycles.

Here, the bit width of the parallel data signal is assumed to be four bits. Thus, the size of one symbol is assumed to be four bits. The test pattern includes, for example, a portion whose bit value is inverted every symbol, that is, every four bit cycles. In a case where the test pattern having the size of two symbols output from the eight flip-flops FF20, FF21, FF22, FF23, FF30, FF31, FF32, and FF33 includes a portion whose bit value is inverted, the detector 33 detects such a position as a symbol boundary.

Note that the test pattern is not limited to the pattern defined in the PCIe (trademark) standard. The designer can variously change the configuration of the test pattern. In addition, the method of detecting the symbol boundary on the basis of the test pattern is not limited to the above method. The detector 33 may store the test pattern in advance, and detect the symbol boundary on the basis of a comparison between the stored test pattern and the test pattern having the size of two symbols output by the eight flip-flops FF20, FF21, FF22, FF23, FF30, FF31, FF32, and FF33.

On the basis of the detected symbol boundary, the detector 33 causes the phase shift frequency divider 34 to shift the phase of the symbol clock so that bit data located at the head of the symbol can be output at a position of bit 0 of the parallel data signal having the 4-bit width.

In the first embodiment, the aligner 158*r* transmits the outputs from the four flip-flops FF20, FF21, FF22, and FF23 to the subsequent circuit, here, the elastic buffer 157*r*, as the parallel data signal. Then, in the configuration illustrated in FIG. 3, a bit output by the flip-flop FF23 out of the 4-bit data output by the four flip-flops FF20, FF21, FF22, and FF23 in one symbol clock is positioned at the head in the serial data signal before being converted into the parallel data signal. Thus, the position of the output data of the FF23 corresponds to bit 0 of the parallel data signal. The detector 33 causes the phase shift frequency divider 34 to adjust the phase of the symbol clock in units of bit cycles such that the symbol boundary is positioned between the output data of the FF23 and the output data of the FF30.

When the adjustment of the phase of the symbol clock is completed, the four flip-flops FF20, FF21, FF22, and FF23 is allowed to fetch and output 4-bit data beginning with the bit data located at the head of the symbol from the parallelized serial data signal output by the SIPO circuit 166*r*. That is, in this embodiment, the output of the bit data located at the head of the symbol with bit 0 of the parallel data signal having the 4-bit width is synonymous with the adjustment of the phase of the symbol clock so that the four flip-flops FF20, FF21, FF22, and FF23 can fetch 4-bit data beginning with the bit data located at the head of the symbol.

Note that the interface device 12 periodically receives the test pattern. The reception of the test pattern is detected in the MAC layer circuit 133*r*. When the reception of the test pattern is detected, the MAC layer circuit 133*r* transmits an instruction (referred to as an alignment instruction) to the detector 33 to perform the symbol alignment. The detector 33 performs the symbol alignment in response to receiving the alignment instruction.

A technique to be compared with the first embodiment will be described. A technique to be compared with the first embodiment will be referred to as a comparative example. According to the comparative example, the aligner detects the symbol boundary on the basis of the test pattern for two symbol cycles output by the eight flip-flops FF20, FF21, FF22, FF23, FF30, FF31, FF32, and FF33. Then, from among the eight flip-flops FF20, FF21, FF22, FF23, FF30, FF31, FF32, and FF33, the aligner selects four flip-flops FF capable of outputting the aligned parallel data signal on the basis of the detection result of the symbol boundary. Thereafter, the aligner transmits output data from four flip-flops FF selected from the eight flip-flops FF20, FF21, FF22, FF23, FF30, FF31, FF32, and FF33 to a subsequent circuit as an aligned parallel data signal.

However, in the comparative example, a large-scale multiplexer is required for selecting the four flip-flops FF from among the eight flip-flops FF20, FF21, FF22, FF23, FF30, FF31, FF32, and FF33. In a case where such a large-scale multiplexer is used, it is necessary to provide a flip-flop for timing adjustment in a circuit of the multiplexer. Then, by providing the flip-flop for timing adjustment, a signal delay occurs in the symbol alignment.

Moreover, in the comparative example, in order to obtain an aligned parallel data signal, it is necessary to always buffer the data for two symbol cycles in the eight flip-flops FF20, FF21, FF22, FF23, FF30, FF31, FF32, and FF33. In the comparative example, the buffering of the data for two symbol cycles in the eight flip-flops FF20, FF21, FF22, FF23, FF30, FF31, FF32, and FF33 may occur a delay by one or more symbol cycles at the time of the symbol alignment.

In contrast, according to the first embodiment of the present disclosure, after the adjustment of the phase of the symbol clock is completed, the aligner 158*r* can cause the four flip-flops FF20, FF21, FF22, and FF23 to fetch the already aligned parallel data signal from the SIPO circuit 166*r* and output the parallel data signal. Thus, according to the first embodiment, it is not needed to provide a large-scale multiplexer in the aligner 158*r*, and also not needed to always store the data for two symbol cycles in the aligner 158*r*. Therefore, according to the first embodiment, the signal delay in the symbol alignment can be suppressed as compared with the comparative example.

Note that a group of the flip-flops FF20, FF21, FF22, FF23, FF30, FF31, FF32, and FF33 is referred to as a first FF group 300. A sub-group of the flip-flops FF20, FF21, FF22, and FF23 in the first FF group 300 is referred to as a second FF group 310. A sub-group of the flip-flops FF30, FF31, FF32, and FF33 in the first FF group 300 is referred to as a third FF group 320.

The first FF group 300 is an example of a second flip-flop group. The second FF group 310 is an example of a first flip-flop group.

The phase shift frequency divider 34 is an example of a first circuit. The bit width "4" of the parallel data signal is an example of the first number. The aligner 158*r* is an example of a second circuit. The CDR circuit 22 is an example of a third circuit. The bit clock is an example of a first clock. The symbol clock is an example of a second clock.

Figure 4:
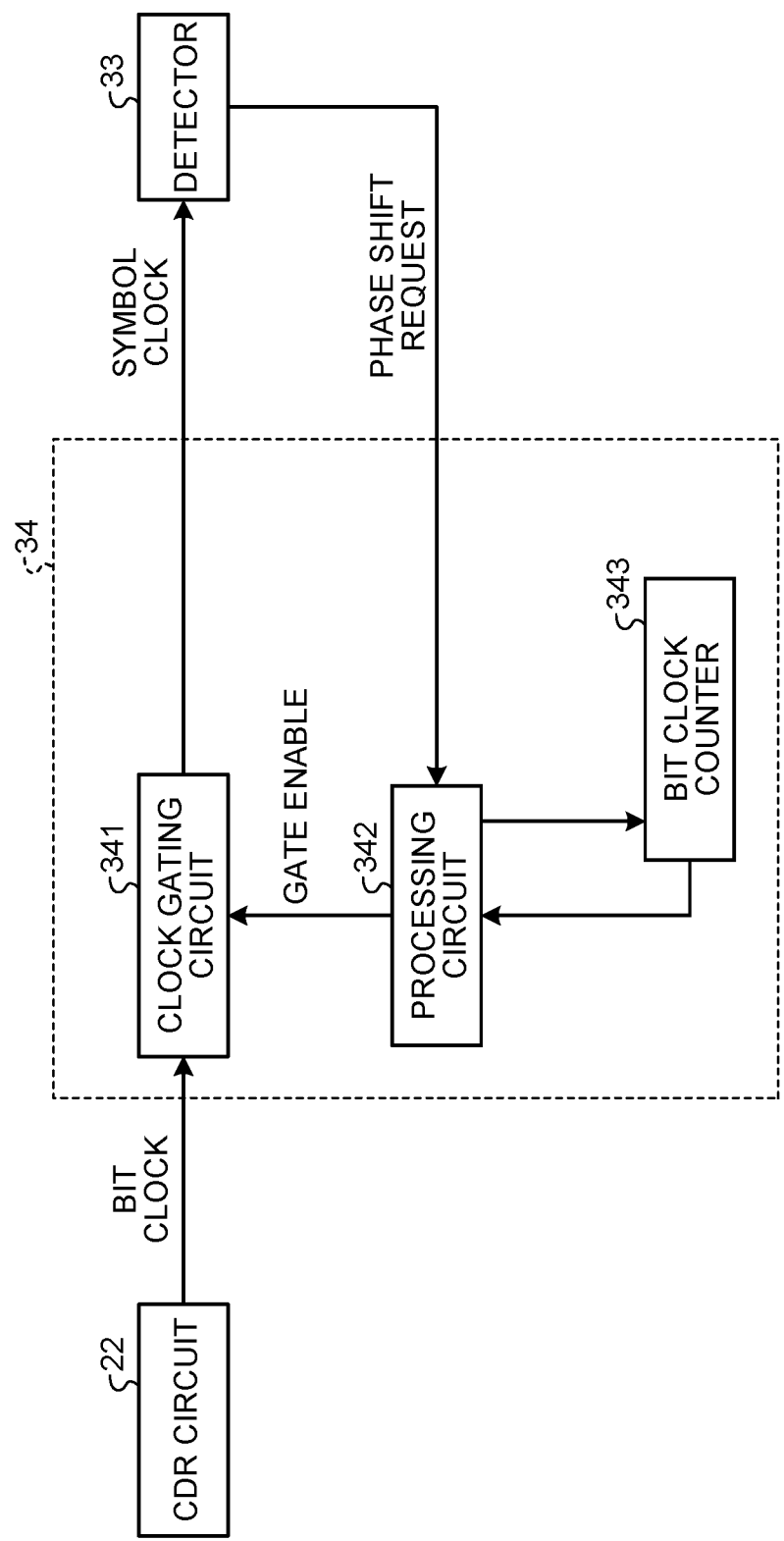
FIG. 4 is a diagram illustrating an example of a detailed configuration of a phase shift frequency divider according to the first embodiment.

FIG. 4 is a diagram illustrating an example of a detailed configuration of the phase shift frequency divider 34 according to the first embodiment. As illustrated in FIG. 4, the phase shift frequency divider 34 includes a clock gating circuit 341, a processing circuit 342, and a bit clock counter 343.

The bit clock counter 343 counts the bit clock supplied from the CDR circuit 22. The bit clock counter 343 outputs the count value to the processing circuit 342.

The clock gating circuit 341 generates a symbol clock by intermittently performing clock gating on the bit clock. The clock gating circuit 341 performs the clock gating under the control of the processing circuit 342. Here, as an example, the processing circuit 342 inputs a gate enable signal to the clock gating circuit 341. The clock gating circuit 341 gates the bit clock when the gate enable signal is at the H level, and does not gate the bit clock when the gate enable signal is at the L level.

When the count value from the bit clock counter 343 reaches a limit value corresponding to the bit width of the parallel data signal, the processing circuit 342 sets the gate enable signal to the L level and resets the count value of the bit clock counter 343 to "0". Then, in the next bit cycle, the processing circuit 342 sets the gate enable signal to the H level.

The bit width of the parallel data signal is assumed to be four bits. Thus, the limit value is set to "4". That is, the processing circuit 342 sets the gate enable signal to the L level every time the count value reaches "4", and resets the count value of the bit clock counter 343 to "0". Thus, the phase shift frequency divider 34 can generate the symbol clock from the L level to the H level at a cycle four times the cycle of the bit clock.

In addition, upon receiving the phase shift request from the detector 33, the processing circuit 342 delays the setting of the gate enable signal to the L level and the resetting of the count value of the bit clock counter 343 to "0" by one bit cycle when the count value first reaches the limit value after receiving the phase shift request. Thus, the phase shift frequency divider 34 can delay the phase of the symbol clock by one bit cycle every time the phase shift request is received.

Note that the configuration of the phase shift frequency divider 34 illustrated in FIG. 4 and the phase shift amount according to the phase shift request are examples. The designer can arbitrarily change the configuration of the phase shift frequency divider 34. In addition, the phase shift frequency divider 34 may be capable of setting the shift amount of the phase according to the phase shift request.

Figure 5:
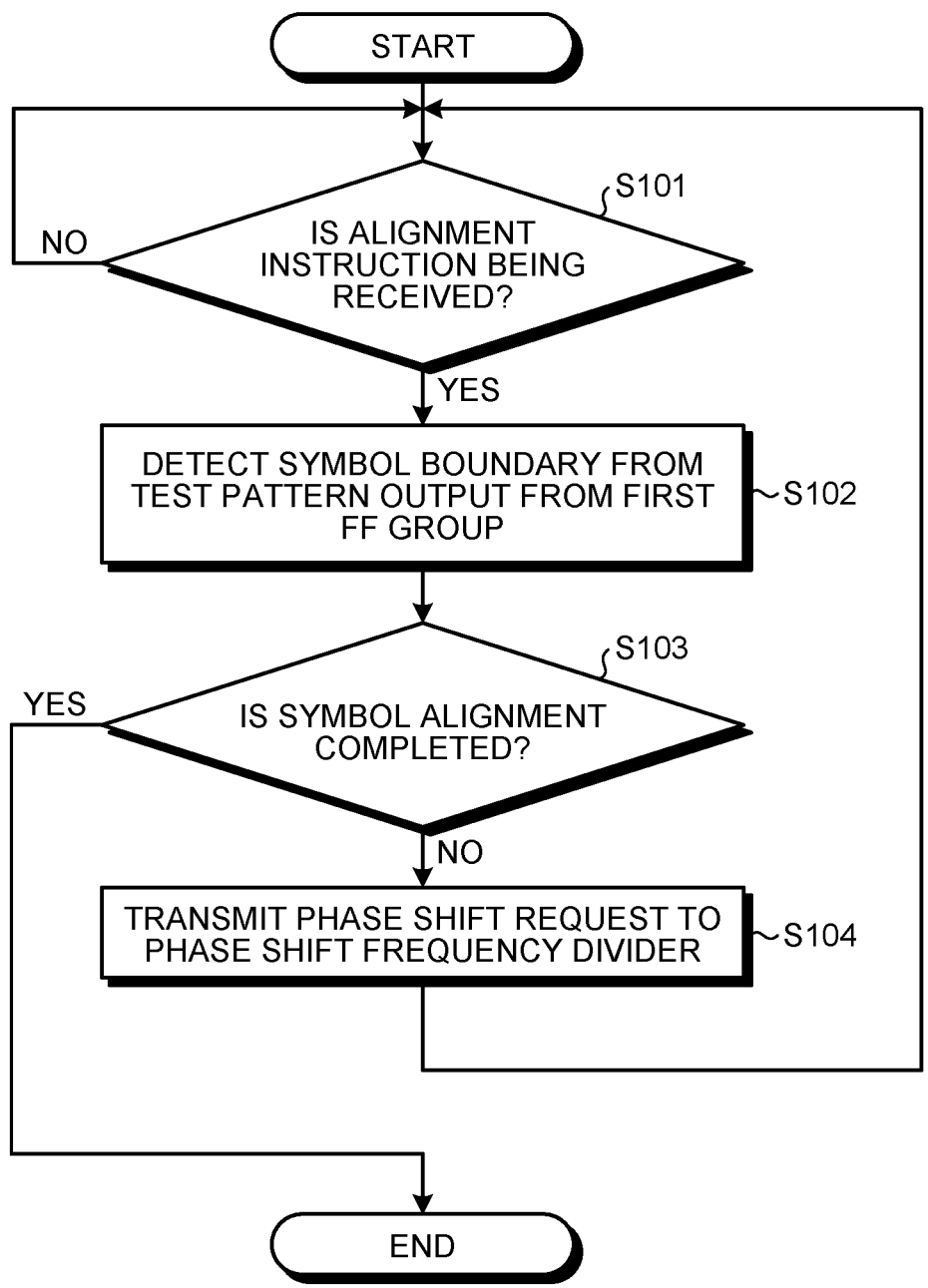
FIG. 5 is a flowchart illustrating an example of operation related to symbol alignment of a detector according to the first embodiment.

FIG. 5 is a flowchart illustrating an example of operation related to symbol alignment of the detector 33 according to the first embodiment.

First, the detector 33 determines whether or not an alignment instruction is being received (S101). For example, the detector 33 receives the alignment instruction over a dedicated signal line. Then, for example, when the level of the signal over the dedicated signal line is the H level, the detector 33 determines that the alignment instruction is being received. When the level of the signal over the dedicated signal line is different from the H level, the detector 33 determines that the alignment instruction is not being received. Alternatively, the detector 33 may determine that the alignment instruction is being received when the level of the signal of the dedicated signal line is the L level. The signal configuration of the alignment instruction is not limited thereto. In addition, the method of notifying the alignment instruction is not limited thereto.

In response to determining that the alignment instruction is not being received (S101: No), the process returns to S101.

In response to determining that the alignment instruction is being received (S101: Yes), the detector 33 detects the symbol boundary on the basis of the test pattern having the size of two symbols output by the first FF group 300 (S102).

Then, the detector 33 determines whether or not the symbol alignment is completed on the basis of the detection result of the symbol boundary (S103). For example, when the symbol boundary is positioned between the output data from the second FF group 310 and the output data from the third FF group 320, the detector 33 determines that the symbol alignment is completed. On the other hand, when the output data from the second FF group 310 includes a symbol boundary or when the output data from the third FF group 320 includes a symbol boundary, the detector 33 determines that the symbol alignment is not completed.

In response to determining that that the symbol alignment is not completed (S103: No), the detector 33 transmits a phase shift request to the phase shift frequency divider 34 (S104). Then, the process returns to S101.

In response to determining that that the symbol alignment is completed (S103: Yes), the operation related to the symbol alignment by the detector 33 ends.

Figure 6:
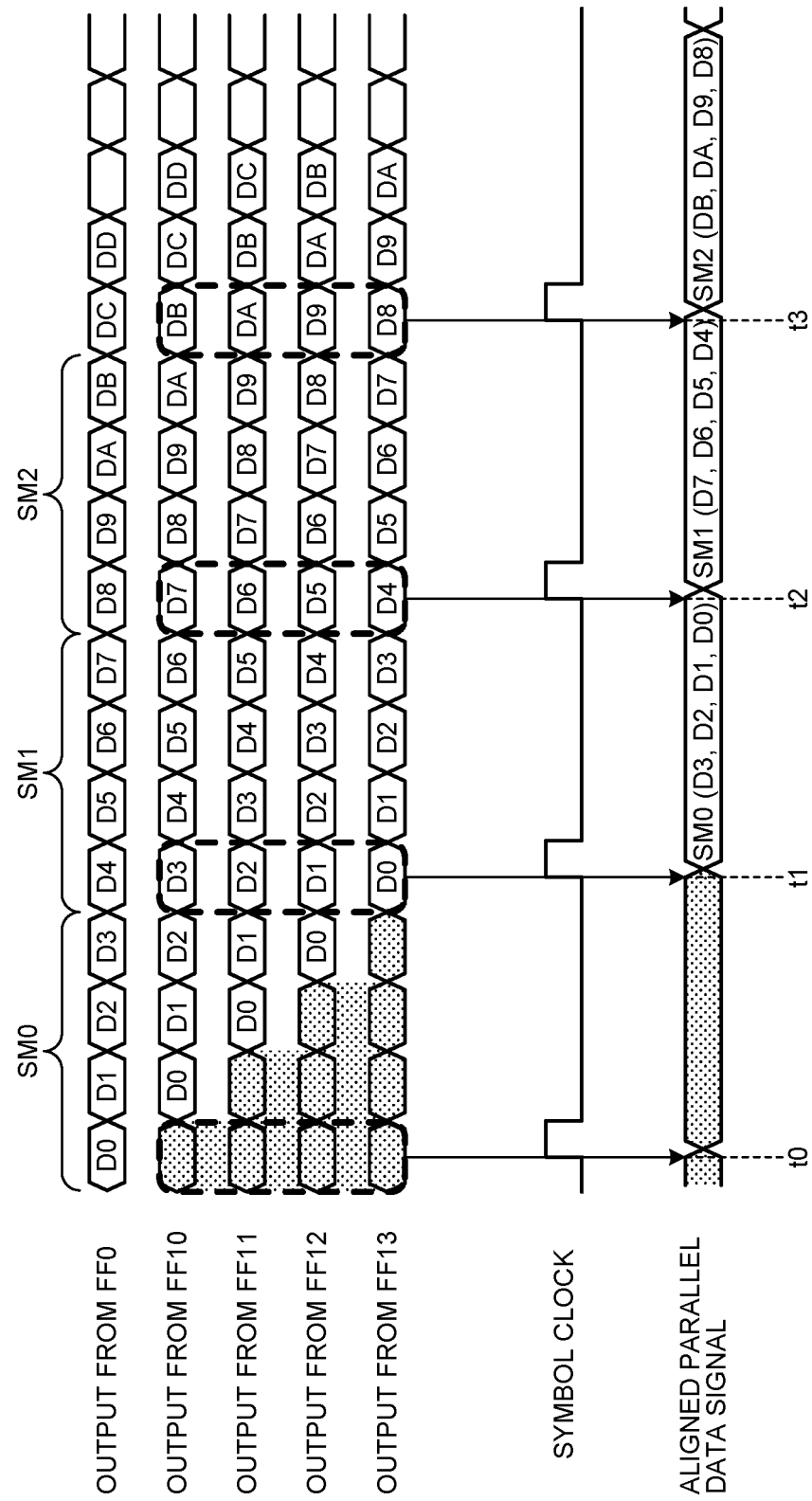
FIG. 6 is a timing chart for explaining a specific example of a parallel data signal aligned by the aligner according to the first embodiment.

FIG. 6 is a timing chart for explaining a specific example of the parallel data signal aligned by the aligner 158r according to the first embodiment. In the drawing, each bit data constituting the bit string output by the flip-flop FF0 is denoted by a sign Dx. The letter "x" in the sign Dx represents a value of hexadecimal numbers in ascending order starting from "0", which corresponds to the output order of the bit data. According to the example illustrated in FIG. 6, the flip-flop FF0 outputs the data D0, the data D1, the data D2, the data D3, the data D4, the data D5, the data D6, the data D7, the data D8, the data D9, the data DA, the data DB, the data DC, and the data DD in this order from a timing t0 in synchronization with the bit clock. Note that a group of the data D0, the data D1, the data D2, and the data D3 constitutes a symbol SM0, a group of the data D4, the data D5, the data D6, and the data D7 constitutes a symbol SM1, and a group of the data D8, the data D9, the data DA, and the data DB constitutes a symbol SM2.

As illustrated in FIG. 6, the flip-flop FF10 delays the bit string output by the flip-flop FF0 by one bit cycle and outputs the delayed bit string. The flip-flop FF11 delays the bit string output by the flip-flop FF0 by two bit cycles and outputs the delayed bit string. The flip-flop FF12 delays the bit string output by the flip-flop FF0 by three bit cycles and outputs the delayed bit string. The flip-flop FF13 delays the bit string output by the flip-flop FF0 by four bit cycles and outputs the delayed bit string.

Under the control of the detector 33, the phase shift frequency divider 34 adjusts in advance the phase of the symbol clock by using the test pattern such that the rising edge of the symbol clock arises at the timing when the bit data located at the head of each symbol is positioned at bit 0 of the parallel data signal. That is, the phase of the symbol clock is adjusted so that the flip-flop FF23 is able to fetch the head bit of the symbol at a timing of a rising edge of the symbol clock.

For example, at a timing t1 which is four bit cycles after the timing t0, the flip-flop FF13 outputs data D0 being bit data located at the head of the symbol SM0. At this timing t1, the rising edge of the symbol clock arises. Thus, the second FF group 310 fetches the symbol SM0 at the timing t1 and outputs the symbol SM0 as a parallel data signal.

At a timing t2 which is four bit cycles after the timing t1, the flip-flop FF13 outputs data D4 being bit data located at the head of the symbol SM1. At this timing t2, the rising edge of the symbol clock arises. Thus, the second FF group 310 fetches the symbol SM1 at the timing t2 and outputs the symbol SM1 as a parallel data signal.

At a timing t3 which is four bit cycles after the timing t2, the flip-flop FF13 outputs data D8 being bit data located at the head of the symbol SM2. At this timing t3, the rising edge of the symbol clock arises. Thus, the second FF group 310 fetches the symbol SM2 at the timing t3 and outputs the symbol SM2 as a parallel data signal.

As described above, according to the first embodiment, the aligner 158r sequentially fetches, in accordance with the symbol clock, the number of bit data corresponding to the bit width of the parallel data signal from the serial data signal parallelized by the SIPO circuit 166r being the shift register, and then outputs the fetched data as the parallel data signal. The detector 33 adjusts the phase of the symbol clock generated by the phase shift frequency divider 34 so that the second FF group 310 can fetch pieces of data beginning with the bit data located at the head of each symbol.

Therefore, the delay of the signal during the symbol alignment can be significantly suppressed as compared with the comparative example.

In addition, according to the first embodiment, the aligner 158*r* includes the first FF group 300 serves to fetch data of the number of bits for two symbols from the SIPO circuit 166*r* by using the symbol clock for two symbol cycles. The detector 33 adjusts the phase of the symbol clock on the basis of the data of the number of bits for two symbols fetched into the first FF group 300.

The aligner 158*r* fetching the data of the number of bits for two symbols into the first FF group 300 enables the detector 33 to detect the position of the symbol boundary. That is, the detector 33 can specify the position of the bit data located at the head of each symbol. Thus, the detector 33 is capable of adjusting the phase of the symbol clock so that the second FF group 310 can fetch pieces of data beginning with the bit data located at the head of each symbol.

Note that the size of data that can be fetched by the first FF group 300 is not limited to the size corresponding to the two symbol cycles. As long as the first FF group 300 can fetch data of a larger number of bits than that of data for one symbol cycle, the detector 33 can detect the symbol boundary and adjust the phase of the symbol clock so that the second FF group 310 can fetch pieces of data beginning with the bit data located at the head of each symbol.

In addition, in the above description, the first FF group 300 is provided as the second flip-flop group capable of fetching data of a larger number of bits than that of data for one symbol cycle. The second FF group 310 as the first flip-flop group is configured as a part of the first FF group 300 as the second flip-flop group that fetches and outputs the parallel data signal in an aligned state. The first flip-flop group and the second flip-flop group may be separately provided in the aligner 158*r*.

Second Embodiment

There are multiple generations in PCIe (trademark) for serial communication standards. In some generations of the PCIe (trademark), a header of a predetermined number of bits is transferred for every predetermined number of symbols between the physical layer on the transmission side and the physical layer on the reception side.

In the second embodiment, an interface device 12*a* as a reception device and a PHY circuit 14*a* as a signal processing circuit in a case where a header of a predetermined number of bits is transferred for every predetermined number of symbols will be described. Hereinafter, a configuration of part different from that of the first embodiment will be described. A configuration of the same part as that of the first embodiment will be omitted or briefly described.

In addition, in the second embodiment, for preventing the description from being complicated, it is assumed that a 1-bit header as a serial data signal is transferred every two symbols between the transmission-side device and the reception-side device. In addition, the size of one symbol is assumed to be four bits, and the bit width of the parallel data signal is assumed to be four bits.

Figure 7:
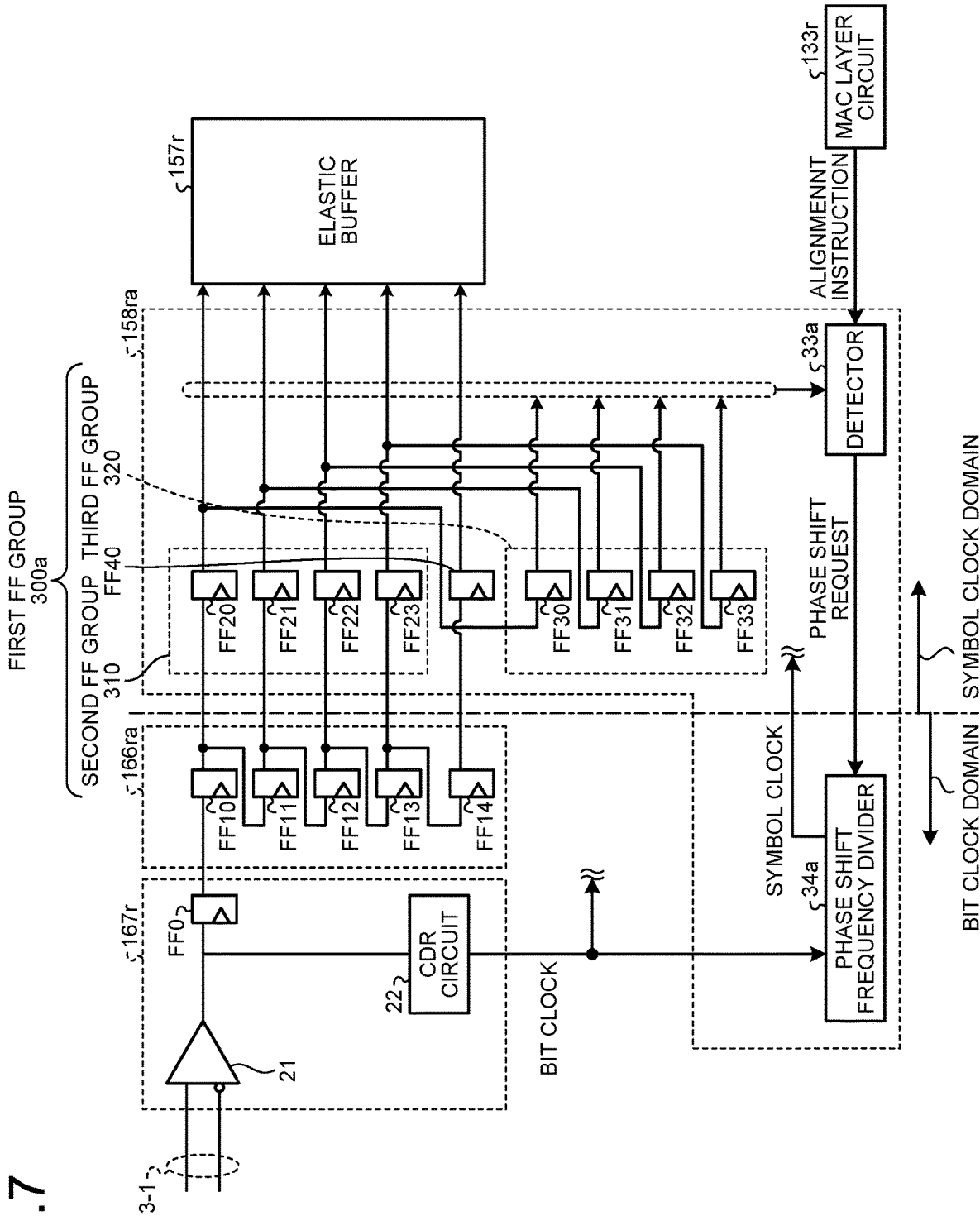
FIG. 7 is a schematic diagram illustrating an example of a detailed circuit configuration of a reception electric circuit, an SIPO circuit, and an aligner included in a PHY circuit which is a signal processing circuit according to a second embodiment.

FIG. 7 is a schematic diagram illustrating an example of a more detailed circuit configuration of the reception electric circuit 167*r*, a SIPO circuit 166*ra*, and an aligner 158*ra* included in a PHY circuit 14*a* according to the second embodiment.

Similarly to the first embodiment, the reception electric circuit 167*r* includes the amplifier 21, the flip-flop FF0, and the CDR circuit 22.

The SIPO circuit 166*ra* includes a flip-flop FF14 in addition to the flip-flops FF10, FF11, FF12, and FF13. The flip-flops FF10, FF11, FF12, FF13, and FF14 are driven in accordance with the bit clock. The flip-flop FF14 is disposed at a subsequent stage of the flip-flop FF13. The serial data signal output by the flip-flop FF13 is input to the flip-flop FF14. Although details will be described later, the flip-flop FF14 serves to pass a header to the aligner 158*ra* after symbol alignment. Although not illustrated in FIG. 7, the bit clock is supplied to the clock input terminal of the flip-flop FF14.

The aligner 158*ra* includes the second FF group 310, a flip-flop FF40, and the third FF group 320. The second FF group 310, the flip-flop FF40, and the third FF group 320 constitute a first FF group 300*a*.

The flip-flop FF40 fetches 1-bit data from the serial data signal output by the flip-flop FF14 at a timing of a rising edge of the symbol clock and outputs the fetched data. Although not illustrated in FIG. 7, the symbol clock is supplied to the clock input terminal of the flip-flop FF40.

The flip-flop FF40 is an example of a third flip-flop group. In the second embodiment, the third flip-flop group includes one flip-flop FF40. The number of flip-flops FF constituting the third flip-flop group is changed in accordance with the size of the header. For example, in a case where the size of the header is two or more bits, the SIPO circuit 166*ra* includes the number of flip-flops FF corresponding to the size of the header as the flip-flops FF serving to pass the data of the header to the aligner 158*ra*. That is, the third flip-flop group includes the number of flip-flops FF corresponding to the size of the header so that the data of the header output by the SIPO circuit 166*ra* can be fetched.

The flip-flop FF30 in the third FF group 320 fetches 1-bit data output by the flip-flop FF20 at a timing based on the symbol clock and outputs the data. The flip-flop FF31 in the third FF group 320 fetches 1-bit data output by the flip-flop FF21 at timing based on the symbol clock and outputs the data. The flip-flop FF32 in the third FF group 320 fetches 1-bit data output by the flip-flop FF22 at timing based on the symbol clock and outputs the data. The flip-flop FF33 in the third FF group 320 fetches 1-bit data output by the flip-flop FF23 at timing based on the symbol clock and outputs the data.

The aligner 158*ra* further includes a detector 33*a* and a phase shift frequency divider 34*a*.

In the second embodiment as well, the interface device 12*a* may receive a test pattern via the first communication path 3-1. The test pattern is configured such that not only the symbol boundary but also the relative position of each symbol boundary from the header can be detected. Such a test pattern is defined in the PCIe (trademark) standard.

Upon detecting the reception of the test pattern, the MAC layer circuit 133*r* transmits an alignment instruction to the detector 33*a*. The detector 33*a* performs symbol alignment in accordance with the alignment instruction.

In response to the alignment instruction, the detector 33*a* detects the symbol boundary and the relative position of the detected symbol boundary from the header on the basis of the parallel data signal for two symbol cycles output by the first FF group 300*a*. The detector 33*a* aligns the bit data located at the head of each symbol to the position of bit 0 of the parallel data signal, by adjusting the phase of the symbol clock on the basis of the detection result. The detector 33*a* transmits a phase shift request to the phase shift frequency divider 34a to cause the phase shift frequency divider 34a to shift the phase of the symbol clock.

As described above, in the second embodiment, the interface device 12a receives a header of a predetermined number of bits for each predetermined number of symbols. Thus, the serial data signal received by the interface device 12a includes symbol boundaries at which the headers are interposed and symbol boundaries at which the headers are not interposed. In other words, the symbols transferred as the serial data signal includes symbols following the headers and symbols not following the headers.

In this embodiment, it is assumed that the interface device 12a receives the header every two symbols. Thus, the interface device 12a alternately receives a symbol following the header and a symbol not following the header.

In a state after symbol alignment, the aligner 158ra fetches a symbol not following the header from the SIPO circuit 166ra as follows. That is, the aligner 158ra simultaneously fetches 4-bit data constituting a symbol not following the header from the SIPO circuit 166ra into the second FF group 310. For this, the timing of the rising edge of the symbol clock is required to come four bit cycles after the aligner 158ra fetches the previous symbol.

Meanwhile, the aligner 158ra fetches a symbol following the header from the SIPO circuit 166ra as follows. That is, when the data of the header is output by the flip-flop FF14, the aligner 158ra simultaneously fetches the data of the header into the flip-flop FF40 and fetches 4-bit data constituting a symbol following the header into the second FF group 310. Thus, the timing of the rising edge of the symbol clock is required to come five bit cycles after the aligner 158ra fetches the previous symbol.

Accordingly, in the second embodiment, it is needed to differentiate the interval of the rising timing of the symbol clock between the case where the aligner 158ra fetches a symbol not following the header and the case where the aligner 158ra fetches a symbol following the header.

In order to address the above need, the phase shift frequency divider 34a has a configuration capable of generating symbol clocks whose interval between the rising edges periodically changes.

Figure 8:
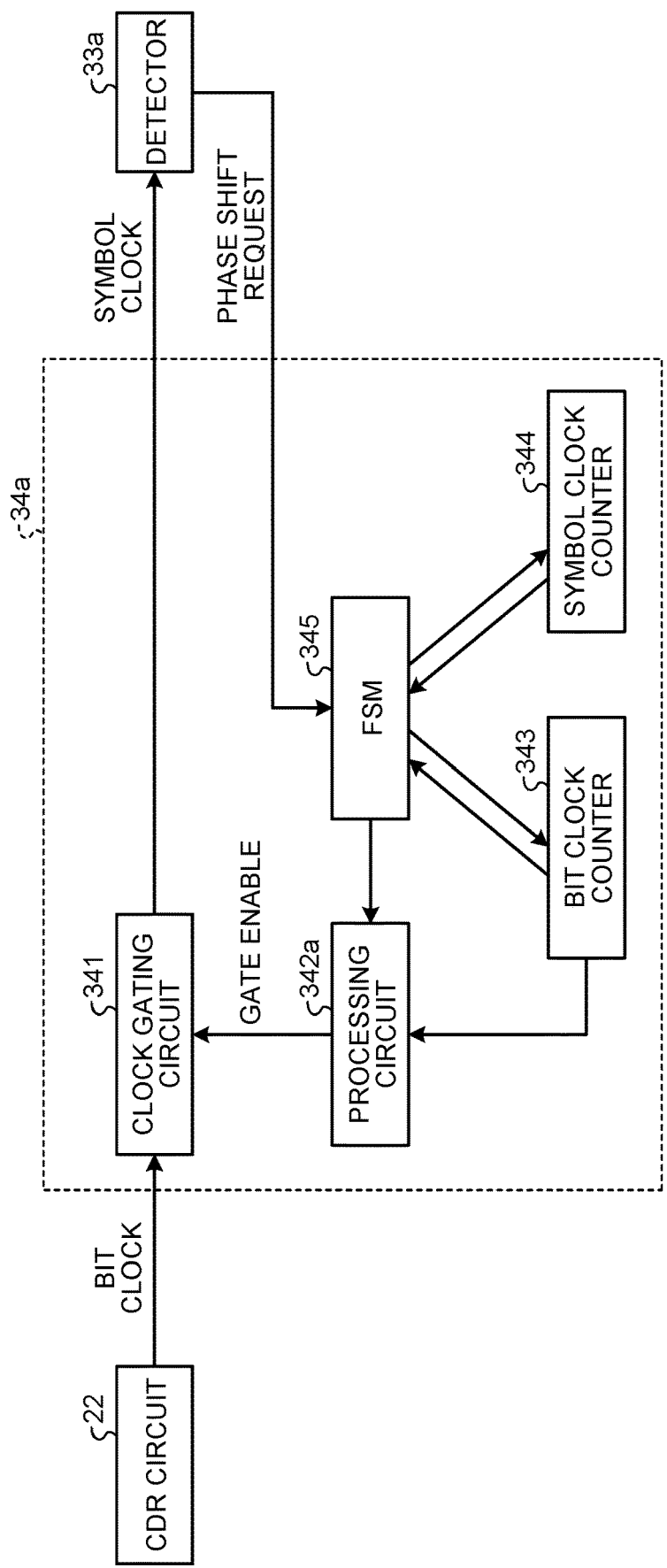
FIG. 8 is a diagram illustrating an example of a detailed configuration of a phase shift frequency divider according to the second embodiment.

FIG. 8 is a diagram illustrating an example of a detailed configuration of a phase shift frequency divider 34a according to the second embodiment. According to the example illustrated in the drawing, the phase shift frequency divider 34a includes the clock gating circuit 341, a processing circuit 342a, the bit clock counter 343, a symbol clock counter 344, and a finite state machine (FSM) 345.

Figure 9:
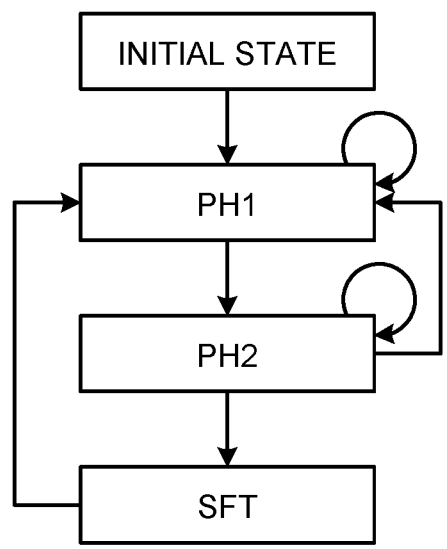
FIG. 9 is a diagram illustrating an example of state transition of an FSM according to the second embodiment.

The FSM 345 controls the bit clock counter 343 and the symbol clock counter 344. As illustrated in FIG. 9, a state of the FSM 345 transitions among a state PH1, a state PH2, and a state SFT.

A limit value for the bit clock counter 343 (referred to as a first limit value) and a limit value for the symbol clock counter 344 (referred to as a second limit value) are set for each of the state PH1 and the state PH2.

Every time the count value of the bit clock counter 343 reaches the first limit value in the state PH1 or the state PH2, the FSM 345 increments the value of the symbol clock counter 344 by one and resets the count value of the bit clock counter 343 to zero.

In the state PH1 or the state PH2, when the count value of the bit clock counter 343 reaches the first limit value, the FSM 345 gives notification to the processing circuit 342a. In addition, in the state PH1 or the state PH2, every time the value of the symbol clock counter 344 reaches the second limit value, the FSM 345 makes a transition from the current state of the state PH1 and the state PH2 to the other state of the state PH1 and the state PH2.

The processing circuit 342a sets the gate enable signal to the clock gating circuit 341 to the L level every time the notification that the count value reaches the first limit value is received from the FSM 345. Thereafter, when one clock cycle has elapsed, the processing circuit 342a sets the gate enable signal to the clock gating circuit 341 to the H level. Accordingly, the processing circuit 342a is able to raise the signal of the symbol clock at an interval corresponding to the first limit value in the state PH1, and raise the signal of the symbol clock at an interval corresponding to the second limit value in the state PH2.

The FSM 345 is also capable of receiving a phase shift request from the detector 33a. Upon receiving the phase shift request, the FSM 345 transitions to the state SFT only once before transitioning from the state PH2 to the state PH1. The period during which the FSM 345 remains in the state SFT is one bit cycle. In a case where the transition of the state from the state PH2 to the state SFT is performed, the FSM 345 delays the notification that the count value has reached the first limit value until the timing of the transition from the state SFT to the state PH1. As a result, the phase of the symbol clock is delayed by one bit clock.

The operation of the phase shift frequency divider 34a will be described with reference to FIGS. 10 and 11. Note that, in the description of FIGS. 10 and 11, to simplify the description, it is assumed that the first limit value in the state PH1 and the second limit value in the state PH1 are each "2", the first limit value in the state PH2 is "3", and the second limit value in the state PH2 is "1".

Figure 10:
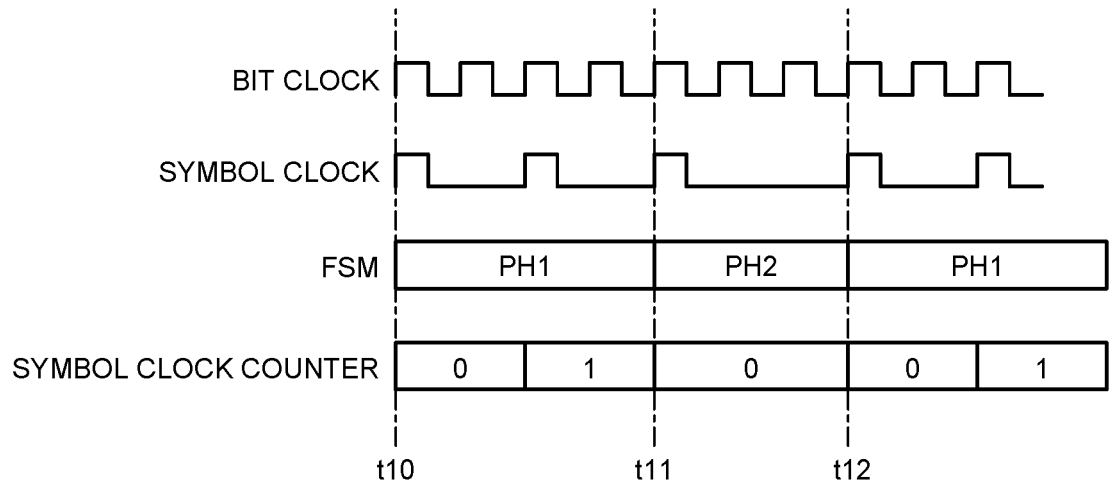
FIG. 10 is a timing chart for explaining the operation of the phase shift frequency divider according to the second embodiment in a steady state.

FIG. 10 is a timing chart for explaining the operation of the phase shift frequency divider 34a according to the second embodiment in a steady state, that is, in a state where no phase shift request is issued. In this timing chart, temporal changes of the signal of the bit clock, the signal of the symbol clock, the state of the FSM 345, and the value of the symbol clock counter 344 are drawn.

At a timing t10 in FIG. 10, the FSM 345 starts operation in the state PH1. In the state PH1, the first limit value is "2", so that the rising edges of the symbol clock arise at 2-bit cycle intervals. In the state PH1, the second limit value is "2". Thus, at a timing t11 when two symbol cycles have elapsed from the timing t10, the FSM 345 transitions from the state PH1 to the state PH2.

In the state PH2, the first limit value is "3", so that the rising edges of the symbol clock arise at 3-bit cycle intervals. In addition, in the state PH2, the second limit value is "1". Thus, at a timing t12 when one symbol cycle has elapsed from the timing t11, the FSM 345 returns from the state PH2 to the state PH1.

After the timing t12, similarly to the operation from the timing t10 to the timing t11, the operation in the state PH1 and the operation in the state PH2 are repeatedly performed.

Figure 11:
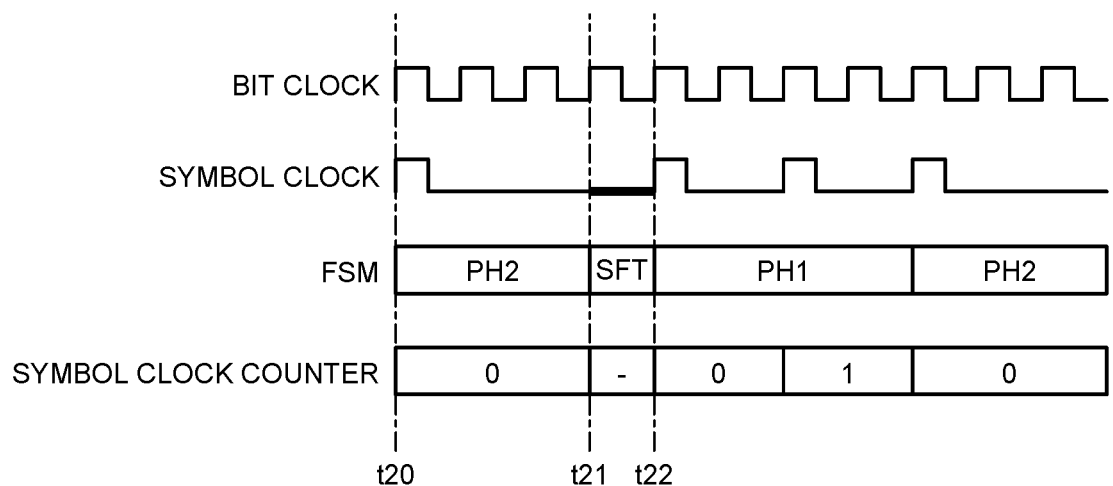
FIG. 11 is a timing chart for explaining the operation of the phase shift frequency divider according to the second embodiment when a phase shift request is issued.

FIG. 11 is a timing chart for explaining the operation of the phase shift frequency divider 34a according to the second embodiment when the phase shift request is issued. A timing t20 illustrated in the drawing is a timing at which the FSM 345 starts the operation in the state PH2 for the first time after receiving the phase shift request.

In the state PH2 for the first time after the FSM 345 receives the phase shift request, when the symbol clock counter 344 reaches the second limit value "1", the FSM 345 transitions to the state SFT before returning to the state PH1 (a timing t21). Then, after one bit cycle from the timing t21, the FSM 345 transitions from the state SFT to the state PH1, and the rising edge of the symbol clock arises (a timing t22).

Thereafter, the same operation as in FIG. 10 is performed until the FSM 345 receives the phase shift request.

In this manner, setting of different values between the state PH1 and the state PH2 as the first limit value enables the phase shift frequency divider 34a to raise the signal of the symbol clock at different intervals between the period of the state PH1 and the period of the state PH2. Thus, one of the state PH1 and the state PH2 can be used as a state for generating a symbol clock rising at an interval in which a symbol not following the header can be fetched by the aligner 158ra. In addition, the other of the state PH1 and the state PH2 can be used as a state for generating a symbol clock rising at an interval in which a symbol following the header can be fetched by the aligner 158ra.

For example, a case where the state PH1 is used as a state for causing the aligner 158ra to fetch a symbol not following the header and the state PH2 is used as a state for causing the aligner 158ra to fetch a symbol following the header will be described. In this case, "4" is set as the first limit value in the state PH1, "1" is set as the second limit value in the state PH1, "5" is set as the first limit value in the state PH2, and "1" is set as the second limit value in the state PH2. Such setting enables the phase shift frequency divider 34a to generate a symbol clock that alternates, every one symbol cycle, a period during which the rising edges arise at an interval of four bit cycles and a period during which the rising edges arise at an interval of five bit cycles.

More generally, it is assumed that the serial data signal transfers an M-bit header every N symbols, and the size of one symbol is K bits. In such a case, for example, "K" is set as the first limit value in the state PH1, "N" is set as the second limit value in the state PH1, "K+M" is set as the first limit value in the state PH2, and "1" is set as the second limit value in the state PH2. As a result, the phase shift frequency divider 34a is able to generate a symbol clock configured such that a period during which the rising edges arise at an interval of K-bit cycles is repeated N times, and, after that, a period during which the rising edges arise at an interval of (K+M)-bit cycles comes only once.

In this manner, by appropriately setting the first limit value and the second limit value in each of the states PH1 and PH2, when fetching a symbol following the header, the phase shift frequency divider 34a is able to generate a symbol clock signal in which a timing of the rising edge is delayed by the number of bit cycles corresponding to the size of the header as compared with the case of fetching a symbol not following the header.

The phase shift frequency divider 34a delays the symbol clock generated in this manner in response to the phase shift request. The phase shift frequency divider 34a delays the phase of the symbol clock by one bit cycle by the operation described with reference to FIG. 11.

Figure 12:
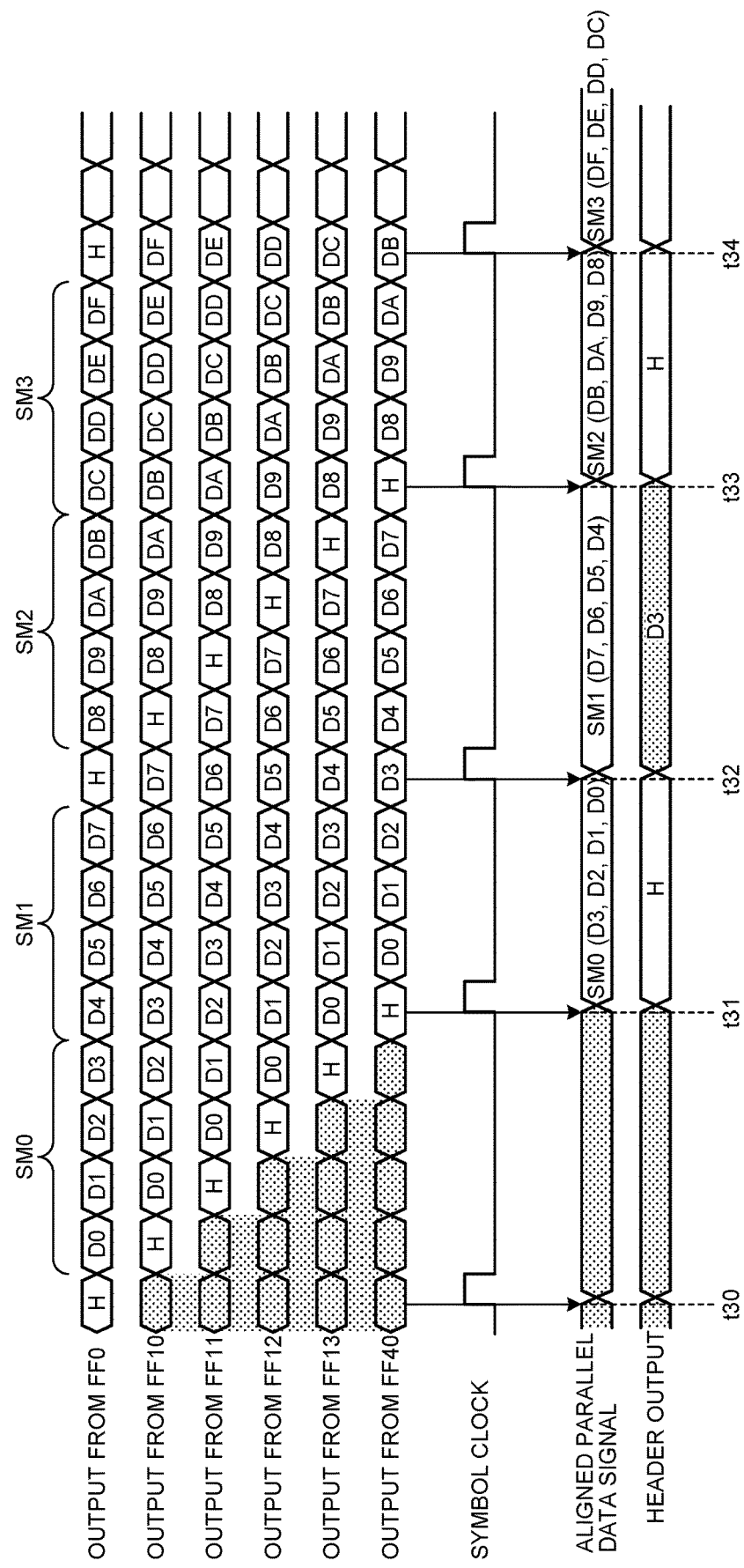
FIG. 12 is a timing chart for explaining a specific example of a parallel data signal aligned by the aligner according to the second embodiment.

FIG. 12 is a timing chart for explaining a specific example of the parallel data signal aligned by the aligner 158ra according to the second embodiment. In the drawing, the header of each bit data constituting the bit string output by the flip-flop FF0 is denoted as H, and bit data excluding the header is denoted by a sign Dx. The letter "x" in the sign Dx is a value of hexadecimal numbers in ascending order starting from 0, which corresponds to the output order of the bit data. According to the example illustrated in FIG. 12, the flip-flop FF0 outputs the header H, the data D0, the data D1, the data D2, the data D3, the data D4, the data D5, the data D6, the data D7, the header H, the data D8, the data D9, the data DA, the data DB, the data DC, the data DD, the data DE, the data DF, and the header H in this order from timing t30 in synchronization with the bit clock. Note that a group of the data D0, the data D1, the data D2, and the data D3 constitutes a symbol SM0, a group of the data D4, the data D5, the data D6, and the data D7 constitutes a symbol SM1, a group of the data D8, the data D9, the data DA, and the data DB constitutes a symbol SM2, and a group of the data DC, the data DD, the data DE, and the data DF constitutes a symbol SM3.

According to the example illustrated in FIG. 12, at a timing t31 which is five bit cycles after a timing t30, the flip-flop FF13 outputs the data D0 being bit data located at the head of the symbol SM0, and the flip-flop FF14 outputs the header H. At this timing t31, the rising edge of the symbol clock arises. Thus, at the timing t31, the second FF group 310 fetches the symbol SM0 and outputs the symbol SM0 as a parallel data signal, and the flip-flop FF40 fetches the header H and outputs the header H as a header signal.

At a timing t32 which is four bit cycles after the timing t31, the flip-flop FF13 outputs the data D4 being bit data located at the head of the symbol SM1. At this timing t32, the rising edge of the symbol clock arises. Thus, at the timing t32, the second FF group 310 fetches the symbol SM1 and outputs the symbol SM1 as a parallel data signal.

At a timing t33 which is five bit cycles after the timing t32, the flip-flop FF13 outputs the data D8 being bit data located at the head of the symbol SM2, and the flip-flop FF14 outputs the header H. At this timing t33, the rising edge of the symbol clock arises. Thus, at the timing t33, the second FF group 310 fetches the symbol SM2 and outputs the symbol SM2 as a parallel data signal, and the flip-flop FF40 fetches the header H and outputs the header H as a header signal.

At a timing t34 which is four bit cycles after the timing t33, the flip-flop FF13 outputs the data DC being bit data located at the head of the symbol SM3. At this timing t34, the rising edge of the symbol clock arises. Thus, at the timing t34, the second FF group 310 fetches the symbol SM3 and outputs the symbol SM3 as a parallel data signal.

In this manner, according to the second embodiment, the header of the predetermined number of bits is transferred for each predetermined number of symbols between the transmission-side device and the reception-side device. Then, as described with reference to FIGS. 8 to 11, the phase shift frequency divider 34a delays the timing at which the symbol clock rises by the number of bit cycles corresponding to the size of the header for each fetching of the predetermined number of symbols, in other words, for each rising of the predetermined number.

Therefore, after symbol alignment, the phase shift frequency divider 34a can generate a symbol clock that enables fetching of pieces of data beginning with bit data located at the head of each symbol into the second FF group 310 and fetching of a header.

In addition, according to the second embodiment, the aligner 158ra further includes the flip-flop FF40 as the third flip-flop group including the number of flip-flops FF corresponding to the size of the header. The detector 33a adjusts the phase of the symbol clock such that the second FF group 310 can fetch a symbol following the header at a rising timing delayed by the number of bit cycles corresponding to the size of the header. The third flip-flop group fetches and outputs the header at delayed rising timing.

Therefore, the aligner 158ra can output the header without failing.

Note that the phase shift frequency divider 34a described with reference to FIGS. 8 to 11 is also applicable to the first embodiment. In a case where the phase shift frequency divider 34a is applied to the signal processing circuit according to the first embodiment, the same value is set as the first limit value of each of the states PH1 and PH2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal processing circuit comprising:
a shift register configured to parallelize, on the basis of a first clock, a serial data signal serving to transfer data including a plurality of symbols, the first clock being a clock signal for transferring the serial data signal;
a first circuit configured to generate a second clock on the basis of the first clock, the second clock being a clock signal for transferring a parallel data signal having a width of a first number of bits;
a first flip-flop group configured to sequentially fetch data of the first number of bits from serial data signals parallelized by the shift register on the basis of the second clock, and output the fetched data of the first number of bits as the parallel data signal; and
a second circuit configured to adjust a phase of the second clock generated by the first circuit such that the first flip-flop group fetches data of the first number of bits beginning with bit data located at a head of a symbol of the plurality of symbols, wherein
the serial data signal transfers a header for each of a second number of symbols, and
the first circuit is configured to delay, for each rising edge of the second number, a timing of a rising edge of the second clock by a number of cycles of the first clock, the number of cycles corresponding to a size of the header.

2. The signal processing circuit according to claim 1, further comprising a second flip-flop group configured to fetch data of a third number of bits from the serial data signals parallelized by the shift register by using a plurality of cycles of the second clock, the third number being larger than the first number,
wherein the second circuit is configured to adjust the phase of the second clock on the basis of the data of the third number of bits fetched by the second flip-flop group.

3. The signal processing circuit according to claim 2, wherein the second flip-flop group includes the first flip-flop group.

4. The signal processing circuit according to claim 1, further comprising a third flip-flop group including the number of flip-flops corresponding to the number of bits of the header, wherein
the second circuit is configured to adjust the phase of the second clock generated by the first circuit such that the data of the first number of bits beginning with bit data located at a head of a first symbol is fetched at a first timing, the first timing being the timing of a rising edge delayed by the number of cycles of the first clock corresponding to the number of bits of the header, the first symbol being a symbol following the header among the plurality of symbols, and
the third flip-flop group is configured to fetch the header from the shift register at the first timing and output the fetched header.

5. The signal processing circuit according to claim 1, further comprising:
an amplifier configured to amplify an input signal and output an amplified signal as the serial data signal;
a third circuit configured to generate the first clock from the serial data signal output by the amplifier; and
an elastic buffer to which the parallel data signal output by the first flip-flop group is input.

6. The signal processing circuit according to claim 2, further comprising:
an amplifier configured to amplify an input signal and output an amplified signal as the serial data signal;
a third circuit configured to generate the first clock from the serial data signal output by the amplifier; and
an elastic buffer to which the parallel data signal output by the first flip-flop group is input.

7. The signal processing circuit according to claim 3, further comprising:
an amplifier configured to amplify an input signal and output an amplified signal as the serial data signal;
a third circuit configured to generate the first clock from the serial data signal output by the amplifier; and
an elastic buffer to which the parallel data signal output by the first flip-flop group is input.

8. The signal processing circuit according to claim 4, further comprising:
an amplifier configured to amplify an input signal and output an amplified signal as the serial data signal;
a third circuit configured to generate the first clock from the serial data signal output by the amplifier; and
an elastic buffer to which the parallel data signal output by the first flip-flop group is input.

9. A reception device comprising:
a signal processing circuit comprising:
a shift register configured to parallelize, on the basis of a first clock, a serial data signal serving to transfer data including a plurality of symbols, the first clock being a clock signal for transferring the serial data signal;
a first circuit configured to generate a second clock on the basis of the first clock, the second clock being a clock signal for transferring a parallel data signal having a width of a first number of bits;
a first flip-flop group configured to sequentially fetch data of the first number of bits from serial data signals parallelized by the shift register on the basis of the second clock, and output the fetched data of the first number of bits as the parallel data signal; and
a second circuit configured to adjust a phase of the second clock generated by the first circuit such that the first flip-flop group fetches data of the first number of bits beginning with bit data located at a head of a symbol of the plurality of symbols; and a link controller configured to transfer data between the signal processing circuit and a software layer, wherein the serial data signal transfers a header for each of a second number of symbols, and the first circuit is configured to delay, for each rising edge of the second number, a timing of a rising edge of the second clock by a number of cycles of the first clock, the number of cycles corresponding to a size of the header.

10. The reception device according to claim 9, wherein the signal processing circuit further comprises a second flip-flop group configured to fetch data of a third number of bits from the serial data signals parallelized by the shift register by using a plurality of cycles of the second clock, the third number being larger than the first number, and the second circuit is configured to adjust the phase of the second clock on the basis of the data of the third number of bits fetched by the second flip-flop group.

11. The reception device according to claim 10, wherein the second flip-flop group includes the first flip-flop group.

12. The reception device according to claim 9, wherein the signal processing circuit further comprises the third flip-flop group including a number of flip-flops corresponding to the number of bits of the header, the second circuit is configured to adjust the phase of the second clock generated by the first circuit such that the data of the first number of bits beginning with bit data located at a head of a first symbol is fetched at a first timing, the first timing being the timing of a rising edge delayed by the number of cycles of the first clock corresponding to the number of bits of the header, the first symbol being a symbol following the header among the plurality of symbols, and the third flip-flop group is configured to fetch the header from the shift register at the first timing and output the fetched header.

13. The reception device according to claim 9, wherein the signal processing circuit further comprises:

an amplifier configured to amplify an input signal and output an amplified signal as the serial data signal;

a third circuit configured to generate the first clock from the serial data signal output by the amplifier; and an elastic buffer to which the parallel data signal output by the first flip-flop group is input.

14. The reception device according to claim 10, wherein the signal processing circuit further comprises:

an amplifier configured to amplify an input signal and output an amplified signal as the serial data signal;

a third circuit configured to generate the first clock from the serial data signal output by the amplifier; and an elastic buffer to which the parallel data signal output by the first flip-flop group is input.

15. The reception device according to claim 11, wherein the signal processing circuit further comprises:

an amplifier configured to amplify an input signal and output an amplified signal as the serial data signal;

a third circuit configured to generate the first clock from the serial data signal output by the amplifier; and an elastic buffer to which the parallel data signal output by the first flip-flop group is input.

16. The reception device according to claim 12, wherein the signal processing circuit further comprises:

an amplifier configured to amplify an input signal and output an amplified signal as the serial data signal;

a third circuit configured to generate the first clock from the serial data signal output by the amplifier; and an elastic buffer to which the parallel data signal output by the first flip-flop group is input.

* * * * *